(12) United States Patent
Xiong et al.

(10) Patent No.: US 10,426,045 B2
(45) Date of Patent: Sep. 24, 2019

(54) RESIN COMPOSITION AND ARTICLE MADE THEREFROM

(71) Applicant: Elite Electronic Material (Zhongshan) Co., Ltd., Zhongshan, Guang Dong Prov. (CN)

(72) Inventors: Xiang Xiong, Zhongshan (CN); Zhilong Hu, Zhongshan (CN)

(73) Assignee: ELITE ELECTRONIC MATERIAL (ZHONGSHAN) CO., LTD., Zhongshan, Guang Dong Province (CN)

( * ) Notice: Subject to any disclaimer, the term of this patent is extended or adjusted under 35 U.S.C. 154(b) by 234 days.

(21) Appl. No.: 15/690,946

(22) Filed: Aug. 30, 2017

(65) Prior Publication Data

US 2018/0324956 A1 Nov. 8, 2018

(30) Foreign Application Priority Data

May 3, 2017 (CN) .......................... 2017 1 0305004

(51) Int. Cl.

| | |
|---|---|
| *H05K 1/09* | (2006.01) |
| *C08L 63/00* | (2006.01) |
| *B32B 15/20* | (2006.01) |
| *H05K 3/38* | (2006.01) |
| *C08J 5/24* | (2006.01) |
| *B32B 15/092* | (2006.01) |
| *H05K 1/03* | (2006.01) |
| *C08G 73/02* | (2006.01) |
| *H05K 3/00* | (2006.01) |

(52) U.S. Cl.
CPC .......... *H05K 3/389* (2013.01); *B32B 15/092* (2013.01); *B32B 15/20* (2013.01); *C08G 73/0233* (2013.01); *C08J 5/24* (2013.01); *C08L 63/00* (2013.01); *H05K 1/0373* (2013.01); *B32B 2307/206* (2013.01); *B32B 2457/08* (2013.01); *C08J 2363/00* (2013.01); *C08J 2463/00* (2013.01); *C08J 2479/04* (2013.01); *C08L 2205/02* (2013.01); *C08L 2205/03* (2013.01); *H05K 1/09* (2013.01); *H05K 3/007* (2013.01); *H05K 2201/012* (2013.01); *H05K 2201/0355* (2013.01)

(58) Field of Classification Search
None
See application file for complete search history.

(56) References Cited

U.S. PATENT DOCUMENTS

| | | | | |
|---|---|---|---|---|
| 8,663,803 B2* | 3/2014 | Chen | .................... | C09D 163/00 428/413 |
| 2012/0136094 A1* | 5/2012 | Chen | .................... | C09D 163/00 523/451 |

* cited by examiner

*Primary Examiner* — Sheeba Ahmed
(74) *Attorney, Agent, or Firm* — Muncy, Geissler, Olds & Lowe, P.C.

(57) ABSTRACT

Disclosed is an assembly comprising an insulation material and a copper foil disposed on the insulation material, wherein the copper foil has a thickness of less than or equal to 6 μm, and the insulation material is made from a resin composition comprising oxazolidone epoxy resin, oxydianiline type benzoxazine resin and a curing agent. The assembly achieves desirable balanced properties in peel strength, glass transition temperature, dimensional change after reflow, thermal resistance, and dielectric properties.

18 Claims, 1 Drawing Sheet

RESIN COMPOSITION AND ARTICLE MADE THEREFROM

CROSS-REFERENCE TO RELATED APPLICATION

This application claims the priority benefits of China Patent Application No. 201710305004.4, filed on May 3, 2017. The entirety the above-mentioned patent application is hereby incorporated by reference herein and made a part of this specification.

BACKGROUND

1. Field of the Disclosure

The present disclosure relates to an insulation material suitable for use in conjunction with an ultra-thin copper foil and more particularly to an assembly of an ultra-thin copper foil and an insulation material, an article made therefrom, such as a prepreg, a prepreg attached with a copper foil, a resin film attached with a copper foil, a laminate (e.g., a copper-clad laminate) or a printed circuit board, and a resin composition used for the insulation material.

2. Description of Related Art

Recently, due to the demands for high speed signal transmission, miniaturization, and light weight of electronic devices, printed circuit boards were continuously developed to realize multiple layers, high density interconnection, fine line (i.e., narrow trace) and narrow spacing.

The fabrication of printed circuit board traces usually involves etching of copper foils. During the formation of circuits with fine lines, if an ordinary copper foil, such as a copper foil with a thickness of between 18 µm and 35 is used, certain limitations of the etching processes fail to fully satisfy the demands for fine line and narrow spacing. In this regard, using an ultra-thin copper foil is advantageous for reducing the amount of copper etched and ensuring satisfactory trace shape and trace width, thereby enhancing the capability of forming fine lines.

While there is a long-standing need for using ultra-thin copper foils in the industry, many problems are encountered by the current fabrication processes. For example, ultra-thin copper foils are prone to roughness change during the processes and may cause weakened adhesiveness, which results in poor adhesion between the ultra-thin copper foils and insulation resin layers and accompanying problems like circuit peeling off. Moreover, since reflow and other thermal treatments are used in the processes, the adhesion between the ultra-thin copper foils and insulation resin layers is significantly deteriorated after reflow. Therefore, there is a need for improving the peel strength between ultra-thin copper foils and insulation materials while at the same time maintaining various physical and chemical properties so as to achieve overall excellent properties.

SUMMARY

Accordingly, the present disclosure provides an assembly comprising an insulation material and a copper foil, particularly an ultra-thin copper foil, disposed on the insulation material, wherein the copper foil has a thickness of less than or equal to 6 and the insulation material is made from a resin composition comprising oxazolidone epoxy resin, oxydianiline type benzoxazine (ODA-Bz) resin and a curing agent.

In one embodiment, the assembly has a peel strength (P/S), indicating the adhesion between the insulation material and the ultra-thin copper foil, as measured by reference to IPC-TM-650 2.4.8 of greater than or equal to 3.0 lb/in.

In another aspect, the present disclosure provides an article made by the assembly, such as a prepreg with copper foil, a resin film with copper foil, a laminate or a printed circuit board.

In one embodiment, the article has at least one or more of the following properties: a glass transition temperature as measured by reference to IPC-TM-650 2.4.24.4 of greater than or equal to 185° C., such as between 190° C. and 220° C.; a dimensional change after reflow as measured by reference to IPC-TM-650 2.4.39 of less than or equal to 0.025%, such as less than or equal to 0.020%, less than or equal to 0.015% or less than or equal to 0.012%; a T288 thermal resistance as measured by reference to IPC-TM-650 2.4.24.1 of greater than or equal to 30 minutes, such as greater than or equal to 60 minutes or between 60 and 300 minutes; a peel strength as measured by reference to IPC-TM-650 2.4.8 of greater than or equal to 3.0 lb/in, such as between 4.2 lb/in and 8.0 lb/in; a dielectric constant at 2 GHz as measured by reference to JIS C2565 of less than or equal to 3.80; and a dissipation factor at 2 GHz as measured by reference to JIS C2565 of less than or equal to 0.0130.

In one embodiment, the present disclosure provides a prepreg made from the resin composition comprising oxazolidone epoxy resin, oxydianiline type benzoxazine resin and a curing agent, wherein the prepreg, after being combined with a copper foil having a thickness of less than or equal to 6 µm and cured, has a peel strength to the copper foil as measured by reference to IPC-TM-650 2.4.8 of between 3.0 lb/in and 8.0 lb/in.

In one embodiment, the present disclosure provides a resin composition suitable for use in conjunction with an ultra-thin copper foil, wherein the resin composition comprises oxazolidone epoxy resin, oxydianiline type benzoxazine resin and a curing agent, and wherein the resin composition, after being at least partially cured, is combinable with a copper foil having a thickness of less than or equal to 6 µm to achieve a peel strength as measured by reference to IPC-TM-650 2.4.8 of between 4.2 lb/in and 8.0 lb/in.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the descriptions, serve to explain the principles of the disclosure.

DETAILED DESCRIPTION OF EMBODIMENTS

Figure 1:
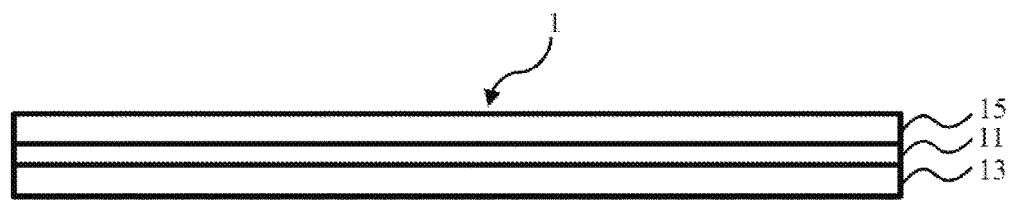
FIG. 1 illustrates an assembly according to one embodiment of the present disclosure.

To enable those skilled in the art to further appreciate the features and effects of the present disclosure, words and terms contained in the specification and appended claims are described and defined. Unless otherwise specified, all technical and scientific terms used herein have the same meaning as commonly understood by those of ordinary skill in the art to which this disclosure pertains. In the case of conflict, the present document and definitions contained herein will control.

As used herein, "a," "an" or similar expression is employed to describe elements and features of the present disclosure. This is done merely for convenience and to give a general sense of the technical features of the present disclosure. Accordingly, this description should be read to include one or at least one and the singular also includes the plural unless it is obvious to mean otherwise.

As used herein, the term "comprises," "comprising," "includes," "including," "has," "having" or any other variant thereof is construed as an open-ended transitional phrase intended to cover a non-exclusive inclusion. For example, a composition or manufacture that comprises a list of elements is not necessarily limited to only those elements but may include other elements not expressly listed or inherent to such composition or manufacture. Further, unless expressly stated to the contrary, the term "or" refers to an inclusive or and not to an exclusive or. For example, a condition "A or B" is satisfied by any one of the following: A is true (or present) and B is false (or not present), A is false (or not present) and B is true (or present), and both A and B are true (or present). In addition, whenever open-ended transitional phrases are used, such as "comprises," "comprising," "includes," "including," "has," "having" or any other variant thereof, it is understood that transitional phrases such as "consisting essentially of" and "consisting of" are also disclosed and included.

In this disclosure, features or conditions presented as a numerical range or a percentage range are merely for convenience and brevity. Therefore, a numerical range or a percentage range should be interpreted as encompassing and specifically disclosing all possible subranges and individual numerals or values therein, particularly all integers therein. For example, a range of "1 to 8" or "between 1 and 8" should be understood as explicitly disclosing all subranges such as 1 to 7, 2 to 8, 2 to 6, 3 to 6, 4 to 8, 3 to 8 and so on, particularly all subranges defined by integers, as well as disclosing all individual values such as 1, 2, 3, 4, 5, 6, 7 and 8. Unless otherwise defined, the aforesaid interpretation rule should be applied throughout the present disclosure regardless broadness of the scope.

Whenever amount, concentration or other numeral or parameter is expressed as a range, a preferred range or a series of upper and lower limits, it is understood that all ranges defined by any pair of the upper limit or preferred value and the lower limit or preferred value are specifically disclosed, regardless whether these ranges are explicitly described or not. In addition, unless otherwise defined, whenever a range is mentioned, the range should be interpreted as inclusive of the endpoints and every integers and fractions in the range.

Given the intended purposes and advantages of this disclosure are achieved, numerals or figures have the precision of their significant digits. For example, 40.0 should be understood as covering a range of 39.50 to 40.49.

As used herein, a Markush group or a list of items is used to describe examples or embodiments of the present disclosure. A skilled artisan will appreciate that all subgroups of members or items and individual members or items of the Markush group or list can also be used to describe the present disclosure. For example, when X is described as being "selected from a group consisting of $X_1$, $X_2$ and $X_3$," it is intended to disclose the situations of X is $X_1$ and X is $X_1$ and/or $X_2$. In addition, when a Markush group or a list of items is used to describe examples or embodiments of the present disclosure, a skilled artisan will understand that any subgroup or any combination of the members or items in the Markush group or list may also be used to describe the present disclosure. Therefore, when X is described as being "selected from a group consisting of $X_1$, $X_2$ and $X_3$," and Y is described as being "selected from a group consisting of $Y_1$, $Y_2$ and $Y_3$," the disclosure of any combination of X is $X_1$ and/or $X_2$ and/or $X_3$ and Y is $Y_1$ and/or $Y_2$ and/or $Y_3$ is considered as explicitly described.

The following embodiments and examples are illustrative in nature and are not intended to limit the present disclosure and its application. In addition, the present disclosure is not bound by any theory described in the background and summary above or the following embodiments or examples.

Assembly

Various embodiments and examples are now described in conjunction with the drawings to improve understanding of the principle as presented herein. Skilled artisans will appreciate that elements in the figures are illustrated for simplicity and clarity and have not necessarily been drawn to scale. For example, the dimensions of some elements in the figures may be exaggerated relative to others to facilitate understanding of the embodiments.

As shown in FIG. 1, one embodiment of the present disclosure provides an assembly 1 primarily comprising an insulation material 13 and a copper foil 11 disposed on the insulation material 13; additionally, a removable carrier 15 may optionally be provided on the copper foil 11 if needed.

As used herein, unless otherwise specified, the term "assembly" refers to a complex, composite or combination structure formed by combining, bonding or joining together the copper foil and the insulation material by any means, such as a prepreg attached with copper foil (comprising reinforcement material) or a resin film attached with copper foil (not comprising reinforcement material); the verb "dispose" or its grammatical variant is broadly interpreted as comprising but not limited to form, arrange, locate and their synonyms; "copper foil" refers to a copper sheet with small thickness, which comprises copper traces formed by etching or other processes; "insulation material" encompasses a wide variety of materials, such as a resin material, useful as an insulation layer contained in articles such as resin films, prepregs, copper-clad laminates, printed circuit boards and other articles described in this disclosure.

In the present disclosure, the insulation material 13 may be made from a resin composition comprising oxazolidone epoxy resin, oxydianiline type benzoxazine resin and a curing agent. For example, the resin composition may be baked at 110° C. to 200° C. to a semi-cured state (B-stage) or a fully cured state (C-stage) to make the insulation material 13. Preferably, the resin composition is baked at 120° C. to 190° C. to a semi-cured state or a fully cured state to make the insulation material 13.

In addition, the resin composition may further optionally comprise other ingredients or components, as described in detail below.

In one embodiment, the copper foil 11 is preferably an ultra-thin copper foil, such as a copper foil with a substantial thickness of less than or equal to 6 μm. The copper foil 11 preferably has a thickness of between 0.5 μm and 5 μm, such as 0.5 μm, 1 μm, 2 μm, 3 μm, 4 μm, and 5 μm, but not limited thereto. A copper foil with a thickness less than or equal to 5 μm may improve the formation of high precision circuits and a copper foil with a thickness greater than or equal to 0.5 μm may prevent both the copper foil 11 and the carrier 15 from being peeled off or inhibit the formation of defective circuits, thereby increasing the yield of the process and effectively avoid breakage of the circuits.

In one preferred embodiment, a proper roughness can be formed on the surface of the copper foil 11 to promote the bonding with the insulation material 13. Specific roughness increasing methods or bonding improving methods can be referred from those employed for treating ordinary copper foils or from physical or chemical roughening methods known in the art.

In one embodiment, a removable carrier 15 can be optionally arranged at the copper foil 11 on a surface opposite to the insulation material 13, as illustrated in FIG. 1.

The removable carrier 15 can be removed from the copper foil 11. Material useful for the removable carrier 15 comprises but is not limited to copper foil material, aluminum foil material, copper alloy foil material, stainless steel foil material and electroplated composite metal foil material. In consideration of the easiness of recycle after peeling off, copper foil material is preferably used as the removable carrier 15.

In one embodiment, the removable carrier 15 may have a thickness of between 18 to 35 μm. Thickness of greater than or equal to 18 μm is advantageous as it may increase the post-processability. Thickness of less than or equal to 35 μm is advantageous as it may reduce the production costs. As used herein, unless otherwise specified, "removable" refers to the situation where the removable carrier 15 may be removed (e.g., peeled off) from the copper foil 11 after the assembly has been subject to certain processing, such as to the conditions used for manufacturing a printed circuit board (e.g., a temperature of 80 to 235° C. and a pressure of 0.1 to 5 MPa).

In one embodiment, between the removable carrier 15 and the copper foil 11, a releasing resin layer may be further included; specific material for the releasing resin layer may be readily selected by a person having ordinary skill in the art without undue experimentation.

In order to improve the removal efficiency, a bonding interface layer can be optionally arranged between the removable carrier 15 and the copper foil 11. The specific type of the aforesaid interface layer is not particularly limited, as long as it may provide suitable adhesion between the copper foil 11 and the removable carrier 15. The interface layer may be made of metal, such as chromium, lead, silver, zinc or nickel; alternatively, oxide or sulfide of these metals (e.g., sodium sulfide, ammonium sulfide and copper sulfide), and chromate thereof may be used as an inorganic bonding interface layer. On the other hand, nitride, sulfide, organic compound and carboxylic acid can be used as an organic bonding interface layer, and inorganic compound can be used as an inorganic bonding interface layer. Specific material for the inorganic bonding interface layer may be readily selected by a person having ordinary skill in the art without undue experimentation.

In one embodiment, the assembly 1 may be made by applying a suitable resin composition, as described below, for making the insulation material 13 to the copper foil 11 by impregnation, coating or other means, followed by baking and heating to convert the resin composition into a semi-cured insulation material 13, thereby further obtaining a prepreg or a resin film attached with copper foil as the assembly 1. This assembly 1 can then be processed by other conventional processes or those described below so as to obtain other articles, including but not limited to a laminate (such as a copper-clad laminate) or a printed circuit board.

Figure 2:
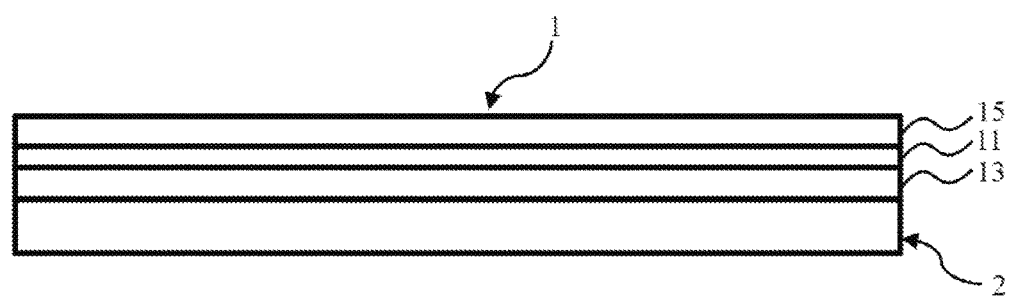
FIG. 2 illustrates an assembly according to one embodiment of the present disclosure superimposed on a substrate.
Figure 3:
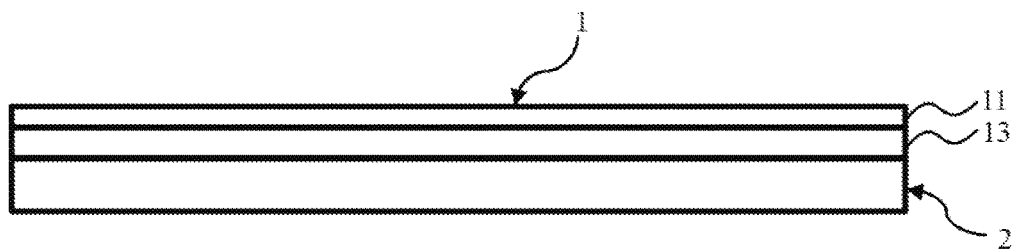
FIG. 3 illustrates an assembly according to one embodiment of the present disclosure superimposed on a substrate after a removable carrier has been removed.

For example, as shown in FIG. 2, the assembly 1 may be stacked on a substrate 2 (e.g., substrate with internal layer circuit) prepared by known processes, so as to join the surface of the insulation material 13 of the assembly 1 with the substrate 2 to form a stack. Next, conventional lamination conditions in the art may be used to perform high temperature lamination to cure the insulation material 13. After that, as illustrated in FIG. 3, if the assembly 1 is provided with a removable carrier 15, then the removable carrier 15 may be peeled off from the assembly 1, and the assembly 1 is then processed by known circuit board processes to form a printed circuit board.

In the present disclosure, the insulation material 13 may further comprise a reinforcement material, which is not particularly limited as long as it may serve the supporting and reinforcing functions. For example, the reinforcement material may be any one of fiber material, woven fabric, non-woven fabric, liquid crystal resin film, polyester (PET) film and polyimide (PI) film, and the woven fabric preferably comprises fiberglass fabric. Types of fiberglass fabric are not particularly limited and may be any commercial fiberglass fabric useful for various printed circuit boards, such as E-glass fabric, D-glass fabric, S-glass fabric, T-glass fabric, L-glass fabric or NE-glass fabric, wherein the fiber may comprise yarns and rovings, in spread form or standard form. Non-woven fabric preferably comprises non-woven fabric made from liquid crystal polymer, such as polyester non-woven fabric, polyurethane non-woven fabric and so on, but not limited thereto. Woven fabric may also comprise woven fabric made from liquid crystal polymer, such as polyester woven fabric, polyurethane woven fabric and so on, but not limited thereto. Preferably, the reinforcement material may be selectively pretreated with a silane coupling agent.

Resin Composition

In the present disclosure, a resin composition suitable for the insulation material 13 primarily comprises: (A) oxazolidone epoxy resin, (B) oxydianiline type benzoxazine resin and (C) curing agent and may optionally comprise other ingredients.

The (A) oxazolidone epoxy resin refers to an epoxy resin having an oxazolidone group, which has a five-membered ring containing nitrogen atom, oxygen atom and a ketone group (C=O). In one embodiment, the oxazolidone epoxy resin has a structure of formula (I):

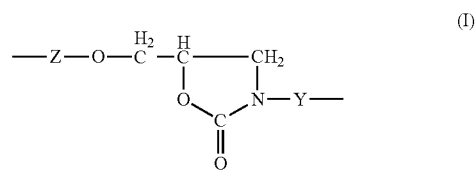

(I)

wherein Y and Z independently represent a divalent group with or without a substituent, such as various divalent groups exemplified in the following embodiments.

In a preferred embodiment, the oxazolidone epoxy resin has a structure of formula (I-1):

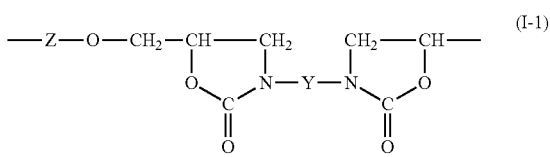

(I-1)

wherein Y and Z independently represent a divalent group with or without a substituent, such as various divalent groups exemplified in the following embodiments.

For example, in one embodiment, Z may represent a divalent group of formula (I-2), such that the oxazolidone epoxy resin may be the epoxy resin of formula (I-3):

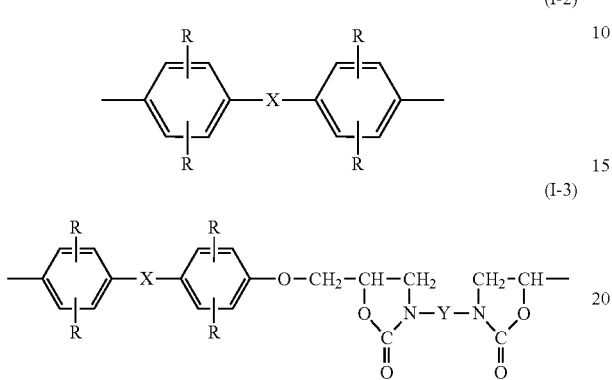

In formula (I-3), X represents a cycloalkylene group having a five-membered to eight-membered ring having at least one substituent selected from $C_1$ to $C_4$ alkyl, $C_6$ to $C_{10}$ aryl and $C_6$ to $C_{10}$ aralkyl, R independently represent hydrogen, halogen, $C_1$ to $C_8$ alkyl, $C_5$ to $C_8$ cycloalkyl, $C_6$ to $C_{10}$ aryl and $C_6$ to $C_{10}$ aralkyl.

In formula (I-1) and formula (I-3), Y comprises any one or more of the following structures represented by formula (I-4) to formula (I-15):

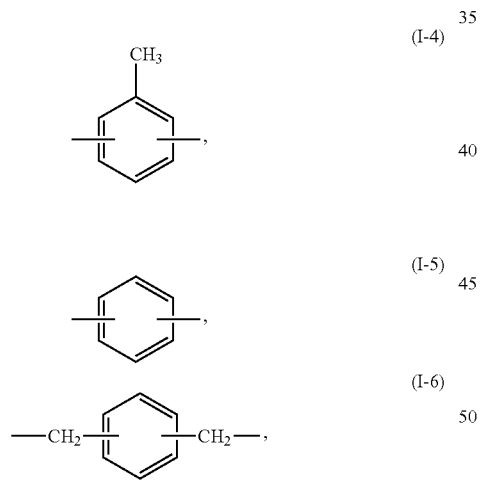

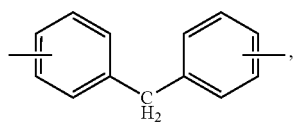

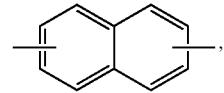

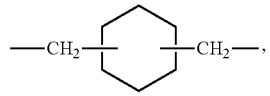

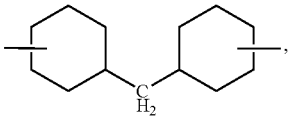

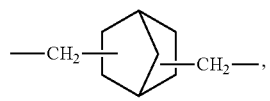

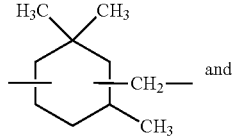

For example, the (A) oxazolidone epoxy resin may be available from Nippon Steel & Sumikin Chemical Co., Ltd. under the trade name TX-1467.

In one embodiment, the oxazolidone epoxy resin contained in the resin composition may have any one structure below or a combination thereof:

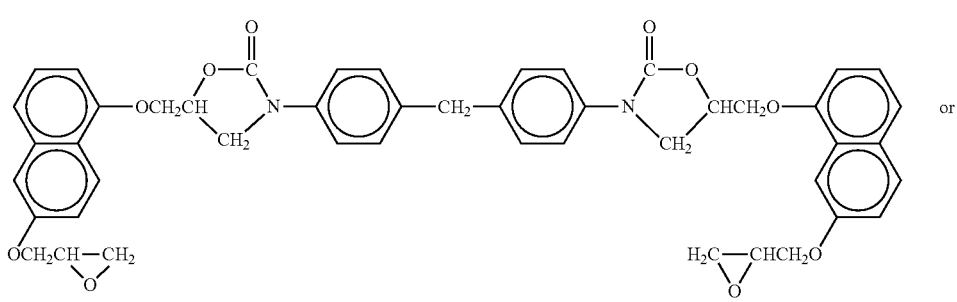

or

-continued

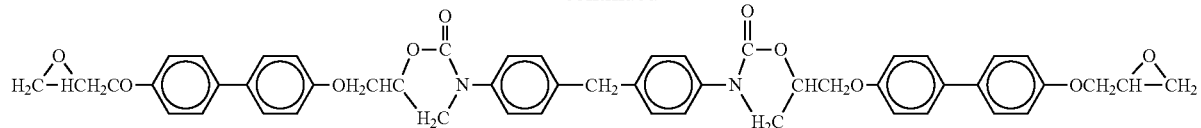

In addition to the (A) oxazolidone epoxy resin, the resin composition may further comprise other epoxy resins, including but not limited to any one or more of the following epoxy resins: bisphenol A epoxy resin, bisphenol F epoxy resin, bisphenol S epoxy resin, bisphenol AD epoxy resin, phenol novolac epoxy resin, trifunctional epoxy resin, tetrafunctional epoxy resin, dicyclopentadiene (DCPD) epoxy resin, biphenyl epoxy resin, phosphorus-containing epoxy resin, p-xylene epoxy resin, naphthalene epoxy resin (e.g., naphthol epoxy resin), and benzofuran epoxy resin. The phenol novolac epoxy resin may be bisphenol A novolac epoxy resin, bisphenol F novolac epoxy resin, biphenyl novolac epoxy resin, phenol benzaldehyde epoxy resin, phenol aralkyl novolac epoxy resin or o-cresol novolac epoxy resin. The phosphorus-containing epoxy resin may be DOPO (9,10-dihydro-9-oxa-10-phosphaphenanthrene-10-oxide) epoxy resin, DOPO-HQ epoxy resin or a combination thereof. The DOPO epoxy resin may be any one or more selected from DOPO-containing phenolic novolac epoxy resin, DOPO-containing cresol novolac epoxy resin and DOPO-containing bisphenol-A novolac epoxy resin. The DOPO-HQ epoxy resin may be any one or more selected from DOPO-HQ-containing phenolic novolac epoxy resin, DOPO-HQ-containing cresol novolac epoxy resin and DOPO-HQ-containing bisphenol-A novolac epoxy resin.

For example, in one embodiment, the resin composition comprises, in addition to oxazolidone epoxy resin, dicyclopentadiene epoxy resin, biphenyl epoxy resin, triphenylmethane epoxy resin, naphthalene epoxy resin or a combination thereof. For example, in one embodiment, the triphenylmethane epoxy resin has the following structure:

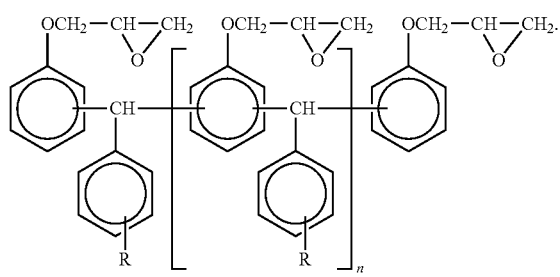

wherein R may be hydrogen or $C_1$ to $C_8$ alkyl or alkyl epoxy group, and n is an integer of 1 to 10. For example, the triphenylmethane epoxy resin may be available from Nan Ya Plastics Corp. under the trade names NPPN-442 and NPPN-433A70.

In one embodiment, the component (B) oxydianiline type benzoxazine resin may serve as a curing agent and has the following structure:

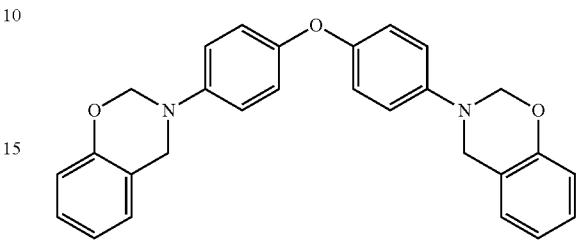

In addition to the component (B) oxydianiline type benzoxazine resin, the resin composition may further optionally comprise different benzoxazine resins, including but not limited to any one or more of the following: bisphenol A type benzoxazine resin, bisphenol F type benzoxazine resin, methylenedianiline benzoxazine resin, diamino diphenyl sulfone benzoxazine resin, dicyclopentadiene benzoxazine resin, phenolphthalein type benzoxazine resin and double bond-containing benzoxazine resin.

In the resin composition described above, the component (C) curing agent is not particularly limited, as long as it comprises an active group for reacting with the epoxy group. In one embodiment, the component (C) curing agent comprises an acid anhydride curing agent, an amine curing agent, a phenol curing agent or a combination thereof.

For example, a conventional epoxy curing agent may be used, and compounds with amino group, acid anhydride group and hydroxyphenyl group are particularly suitable. For example, dicyandiamide and its derivative, organic hydrazide, amino imide, aliphatic amine, aromatic amine, tertiary amine, polyamine salt, microcapsule curing agent, imidazole curing agent, acid anhydride, novolac or polymercaptans may all be used. The curing agent may comprise any one or a combination of two or more of the above-listed compounds.

In one embodiment, the component (C) curing agent is an aromatic amine curing agent, including but not limited to any one or a combination of diamino diphenyl sulfone, diamino diphenyl methane, diamino diphenyl ether, and diamino diphenyl sulfide.

In one embodiment, the component (C) curing agent is a novolac curing agent, such as but not limited to any one or a combination of a phenol novolac resin, a naphthol novolac resin, a biphenyl novolac resin, and a dicyclopentadiene phenol resin.

In one embodiment, the component (C) curing agent is an acid anhydride curing agent, such as but not limited to a mono-functional acid anhydride, a multi-functional acid anhydride, a carboxyl-containing acid anhydride or a combination thereof.

In one embodiment, the component (C) curing agent is a styrene maleic anhydride resin, a tetra-functional phenol resin, diamino diphenyl sulfone or a combination thereof.

In one embodiment, the component (C) curing agent is one or a combination of a styrene maleic anhydride resin, a dicyclopentadiene phenol resin, and diamino diphenyl ether.

In one embodiment, the component (C) curing agent is one or a combination of a styrene maleic anhydride resin, a biphenyl novolac resin, and dicyandiamide.

For example, the styrene maleic anhydride resin may be a styrene maleic anhydride, in which the molar ratio of styrene to maleic anhydride is 1:1, 2:1, 3:1, 4:1, 6:1, 8:1 or 12:1. Useful styrene maleic anhydride may be but not limited to styrene maleic anhydride copolymers such as SMA-1000, SMA-2000, SMA-3000, EF-30, EF-40, EF-60 and EF-80 sold by Cray Valley. Additionally, the styrene maleic anhydride resin may also be an esterified styrene maleic anhydride copolymer, such as esterified styrene maleic anhydride copolymers SMA1440, SMA17352, SMA2625, SMA3840 and SMA31890 sold by Cray Valley. The styrene maleic anhydride resin can be added individually or as a combination to the resin composition of this disclosure.

For example, the tetra-functional phenol resin has the following structure:

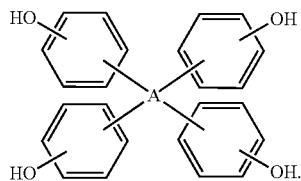

In the above structure, A is $C_2$ to $C_6$ alkylene, such as a linear or branched alkylene with 2, 3, 4, 5 or 6 carbon atoms. For example, the tetra-functional phenol resin has the following structure:

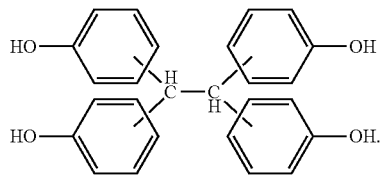

Preferably, the tetra-functional phenol resin has the following structure:

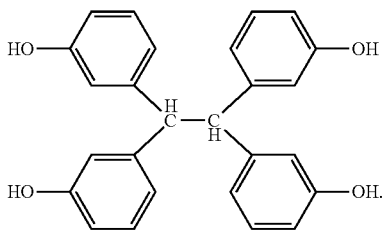 [SMILES: Oc1cccc(C(c2cccc(O)c2)C(c2cccc(O)c2)c2cccc(O)c2)c1]

For example, the dicyclopentadiene phenol resin is a phenol resin containing a dicyclopentadiene structure, such as SD-1806, SD-1809 or SD-1819 sold by Hexion.

In the resin composition described above, the contents or use amounts of the oxazolidone epoxy resin, the oxydianiline type benzoxazine resin and the curing agent are not particularly limited. In a preferred embodiment, the resin composition comprises 100 parts by weight of the epoxy resin (including 20 to 60 parts by weight of the oxazolidone epoxy resin), 20 to 80 parts by weight of the oxydianiline type benzoxazine resin and a proper amount of the curing agent.

In another preferred embodiment, the resin composition comprises 20 to 60 parts by weight of the oxazolidone epoxy resin, 40 to 80 parts by weight of another one or more epoxy resins described above, 20 to 80 parts by weight of the oxydianiline type benzoxazine resin and 1 to 30 parts by weight of the curing agent, wherein the curing agent is styrene maleic anhydride, diamino diphenyl sulfone or tetra-functional phenol resin.

In another preferred embodiment, the resin composition comprises 20 to 60 parts by weight of the oxazolidone epoxy resin, 40 to 80 parts by weight of another one or more epoxy resins described above, 20 to 80 parts by weight of the oxydianiline type benzoxazine resin and 1 to 30 parts by weight of the curing agent, wherein the curing agent is styrene maleic anhydride, diamino diphenyl ether, dicyclopentadiene phenol resin or a combination thereof.

In another preferred embodiment, the resin composition comprises 20 to 60 parts by weight of the oxazolidone epoxy resin, 40 to 80 parts by weight of another one or more epoxy resins described above, 20 to 80 parts by weight of the oxydianiline type benzoxazine resin and 1 to 30 parts by weight of the curing agent, wherein the curing agent is styrene maleic anhydride, biphenyl novolac resin, dicyanamide or a combination thereof.

In another preferred embodiment, the resin composition comprises 100 parts by weight of the epoxy resin, 20 to 80 parts by weight of the oxydianiline type benzoxazine resin and 10 to 30 parts by weight of the styrene maleic anhydride resin as the curing agent, wherein the 100 parts by weight of the epoxy resin comprises 20 to 60 parts by weight of the oxazolidone epoxy resin.

In one embodiment, the resin composition further comprises polyphenylene ether resin, another benzoxazine resin, cyanate ester resin, isocyanate resin, polyolefin resin, maleimide resin, polyester, polyamide, (meth)acrylic resin, polyimide or a combination thereof, wherein the use amount of the aforesaid ingredients may be 1 to 100 parts by weight relative to 100 parts by weight of the epoxy resin.

In one embodiment, the resin composition consists of a first epoxy resin, a second epoxy resin, the oxydianiline type benzoxazine resin, the curing agent, inorganic filler, catalyst and solvent, wherein the first epoxy resin is the oxazolidone epoxy resin, and the second epoxy resin comprises dicyclopentadiene epoxy resin, biphenyl epoxy resin, triphenylmethane epoxy resin, naphthalene epoxy resin or a combination thereof. In the above embodiment, the resin composition further comprises polyphenylene ether resin, another benzoxazine resin, cyanate ester resin, isocyanate resin, polyolefin resin, maleimide resin, polyester, polyamide, (meth)acrylic resin, polyimide or a combination thereof, wherein the use amount of the aforesaid ingredients may be 1 to 100 parts by weight relative to 100 parts by weight of the epoxy resin.

Unless otherwise specified, the polyphenylene ether resin used in this disclosure is not particularly limited and may be any one or more commercial products or a combination thereof examples include but are not limited to dihydroxyl-terminated polyphenylene ether resin (e.g., SA-90 available from SABIC), vinylbenzyl-terminated polyphenylene ether resin (e.g., OPE-2st available from Mitsubishi Gas Chemical Co., Inc.), vinyl-benzylated modified bisphenol A polyphenylene ether, methacrylate-terminated polyphenylene ether resin (e.g., SA-9000 available from SABIC), amino-terminated polyphenylene ether resin or maleimide or maleic anhydride-modified polyphenylene ether resin.

Unless otherwise specified, the cyanate ester resin used in the present disclosure is not particularly limited and may be any commercial product or a combination thereof, such as a compound with an Ar—O—C≡N structure, wherein Ar represents an aromatic group with or without substituent. Examples include but are not limited to novolac cyanate ester resin, bisphenol A type cyanate ester resin, bisphenol F type cyanate ester resin, dicyclopentadiene-containing cyanate ester resin, naphthalene-containing cyanate ester resin, phenolphthalein cyanate ester resin, adamantane cyanate ester resin or fluorene cyanate ester resin. The novolac cyanate ester resin may be bisphenol A novolac cyanate ester resin, bisphenol F novolac cyanate ester resin or a combination thereof. For example, the cyanate ester resin may be available under the trade name Primaset PT-15, PT-30S, PT-60S, CT-90, BADCY, BA-100-10T, BA-200, BA-230S, BA-300S, BTP-2500, BTP-6020S, DT-4000, DT-7000, Methylcy, and ME-240S sold by Lonza.

Unless otherwise specified, the isocyanate resin used in the present disclosure is not particularly limited and may be any commercial product or a combination thereof. Examples include but are not limited to 1,4-cyclohexane diisocyanate, isophorone diisocyanate, methylene bis(4-cyclohexyliso-cyanate), hydrogenated 1,3-xylylene diisocyanate and hydrogenated 1,4-xylylene diisocyanate.

Unless otherwise specified, the polyolefin resin used in the present disclosure is not particularly limited and may be any commercial product or a combination thereof. Examples include but are not limited to styrene-butadiene-divinylbenzene terpolymer, styrene-butadiene-maleic anhydride terpolymer, vinyl-polybutadiene-urethane oligomer, styrene butadiene copolymer, hydrogenated styrene butadiene copolymer, styrene isoprene copolymer, hydrogenated styrene isoprene copolymer, methylstyrene copolymer, petroleum resin, cycloolefin copolymer or a combination thereof.

The maleimide resin described herein refers to a compound, mixture, monomer, oligomer or polymer containing at least one maleimide functional group in its structure. Unless otherwise specified, the maleimide resin used in the present disclosure is not particularly limited and may be any commercial product or a combination thereof. Examples include but are not limited to 4,4'-diphenylmethane bismaleimide, oligomer of phenylmethane maleimide, m-phenylene bismaleimide, bisphenol A diphenyl ether bismaleimide, 3,3'-dimethyl-5,5'-diethyl-4,4'-diphenylmethane bismaleimide, 4-methyl-1,3-phenyl ene bismaleimide, 1,6-bismaleimide-(2,2,4-trimethyl hexane), N-2,3-xylylmaleimide, N-2,6-xylenemaleimide, N-phenylmaleimide, prepolymer thereof or a combination thereof. The aforesaid prepolymer may for example be a prepolymer of diallyl compound and maleimide compound, a prepolymer of diamine and maleimide compound or a prepolymer of multifunctional amine and maleimide compound.

Unless otherwise specified, the polyester used in the present disclosure is not particularly limited and may be any commercial product or a combination thereof. Examples include but are not limited to HPC-8000 available from D.I.C. Corporation.

In one embodiment, the resin composition further comprises one or more additives selected from the following group: a curing accelerator, a flame retardant, an inorganic filler, a solvent, a toughening agent and a silane coupling agent.

Unless otherwise specified, the present disclosure uses a curing accelerator for increasing curing rate of resin, and the curing accelerator, which may be any commercial product or a combination thereof, may be used at an amount of 0.001 to 5 parts by weight relative to 100 parts by weight of the epoxy resin. The curing accelerator may comprise a catalyst, such as a Lewis base or a Lewis acid. The Lewis base may include imidazole, boron trifluoride amine complex, ethyl-triphenyl phosphonium chloride, 2-methylimidazole, 2-phenyl-1H-imidazole, 2-ethyl-4-methylimidazole, triphenyl-phosphine, 4-dimethylaminopyridine or any combination thereof. The Lewis acid may comprise metal salt compounds, such as those of manganese, iron, cobalt, nickel, copper and zinc, such as zinc octanoate, cobalt octanoate, cobalt acetylacetonate, or zinc acetylacetonate as a metal catalyst. Alternatively, the curing accelerator may be a peroxide capable of producing free radicals, including but not limited to dicumyl peroxide, tert-butyl peroxybenzoate, 2,5-dimethyl-2,5-di(tert-butylperoxy)-3-hexyne, di(tert-butylperoxyisopropyl)benzene or any combination thereof.

Unless otherwise specified, the flame retardant used in the present disclosure is not particularly limited, and may be used at an amount of 1 to 100 parts by weight relative to 100 parts by weight of the epoxy resin. The flame retardant may be any one or a combination of commercial products, including but not limited to phosphorus-containing flame retardant, preferably any one or more selected from the following group: ammonium polyphosphate, hydroquinone bis-(diphenyl phosphate), bisphenol A bis-(diphenylphosphate), tri(2-carboxyethyl) phosphine (TCEP), phosphoric acid tris(chloroisopropyl) ester, trimethyl phosphate (TMP), dimethyl methyl phosphonate (DMMP), resorcinol bis(dixylenyl phosphate) (RDXP, such as commercially available PX-200, PX-201, and PX-202), phosphazene (such as commercially available SPB-100, SPH-100, and SPV-100), melamine polyphosphate, DOPO and its derivatives or resins, melamine cyanurate and tri-hydroxy ethyl isocyanurate.

For example, the flame retardant may be a DOPO compound, a DOPO resin (e.g., DOPO-HQ, DOPO-NQ, DOPO-PN, or DOPO-BPN), and a DOPO-containing epoxy resin, wherein DOPO-PN is a DOPO phenol novolac compound, and DOPO-BPN may be a bisphenol novolac compound, such as DOPO-BPAN (DOPO-bisphenol A novolac), DOPO-BPFN (DOPO-bisphenol F novolac) or DOPO-BPSN (DOPO-bisphenol S novolac).

Unless otherwise specified, the inorganic filler used in the present disclosure is not particularly limited, and may be used at an amount of 10 to 300 parts by weight relative to 100 parts by weight of the epoxy resin. The inorganic filler may by any one or a combination of commercial products, examples comprising silica (fused, non-fused, porous or hollow type), aluminum oxide, aluminum hydroxide, magnesium oxide, magnesium hydroxide, calcium carbonate, aluminum nitride, boron nitride, aluminum silicon carbide, silicon carbide, titanium dioxide, zinc oxide, zirconium oxide, mica, boehmite (A100H), calcined talc, talc, silicon nitride and calcined kaolin. Moreover, the inorganic filler can be spherical, fibrous, plate-like, particulate, sheet-like or whisker-like and can be optionally pretreated by a silane coupling agent.

In the present disclosure, the purpose of adding solvent is to change the solid content of the resin composition and to adjust the viscosity of the resin composition, wherein the solvent may be used at an amount of 30 to 300 parts by weight relative to 100 parts by weight of the epoxy resin. Unless otherwise specified, the solvent used in the present disclosure is not particularly limited as long as it is suitable for dissolving or diluting the resin composition, examples including but not limited to methanol, ethanol, ethylene glycol monomethyl ether, acetone, butanone (methyl ethyl ketone), methyl isobutyl ketone, cyclohexanone, toluene, xylene, methoxyethyl acetate, ethoxyethyl acetate, propoxyethyl acetate, ethyl acetate, dimethyl formamide, propylene glycol methyl ether, or a mixture thereof.

Unless otherwise specified, the toughening agent used in the present disclosure is not particularly limited and may be any one or a combination of commercial products, examples including but not limited to rubber resin, carboxyl-terminated butadiene-acrylonitrile (CTBN), rubber-modified epoxy resin and core-shell rubber.

Unless otherwise specified, the silane coupling agent used in the present disclosure is not particularly limited and may be any one or a combination of commercial products, examples including but not limited to silane compounds, modified silane compounds, and modified siloxane compounds which may be further categorized, according to the functional groups, into amino silane compounds, alkenyl-containing silane compounds, and epoxy silane compounds.

In one embodiment, the present disclosure provides a resin composition primarily comprising an oxazolidone epoxy resin, an oxydianiline type benzoxazine resin and a curing agent. In another embodiment, the resin composition of this disclosure primarily consists of a first epoxy resin, a second epoxy resin, an oxydianiline type benzoxazine resin, a curing agent, an inorganic filler, a catalyst and a solvent, wherein the first epoxy resin is an oxazolidone epoxy resin, and the second epoxy resin comprises a dicyclopentadiene epoxy resin, a biphenyl epoxy resin, a triphenylmethane epoxy resin, a naphthalene epoxy resin or a combination thereof.

By properly adjusting the composition of the resin composition to change the properties of the insulation material 13, various articles made by the assembly 1, such as a prepreg attached with copper foil, a resin film attached with copper foil, a laminate (e.g., copper-clad laminate) or a printed circuit board, may have one, more or all of the following properties: higher copper foil peel strength (particularly when the copper foil is an ultra-thin copper foil), higher glass transition temperature, high dimensional stability after reflow, low dielectric constant, low dissipation factor, high thermal resistance and high flame retardancy, thereby being useful for producing a multi-layer printed circuit board or a semiconductor device with enhanced reliability.

Manufacturing Process and Property Characterization

According to the present disclosure, the assembly and various articles made therefrom may be prepared according to the following processes, mainly comprising Step (1) and Step (2).

(1) Preparation of resin varnish: using a suitable stirrer to mix and dissolve the resin composition in solvent, followed by stirring to form a resin varnish. The solvent may comprise at least one or a combination selected from methanol, ethanol, ethylene glycol methyl ether, acetone, methyl ethyl ketone, methyl isobutyl ketone, cyclohexane, cyclohexanone, toluene, xylene, methoxyethyl acetate, ethoxyethyl acetate, propoxyethyl acetate, ethyl acetate, dimethylformamide, propylene glycol methyl ether, γ-butyrolactone, dimethyl sulfoxide, cellulose solvent, and diisobutyl ketone. The stirrer may be for example an ultrasonic dispersion system, a high pressure expansion dispersion system, a high speed rotary dispersion system, a ball milling system, a high speed shear dispersion system, or an automatic rotary dispersion system, but not limited thereto.

In the resin varnish, the content of the resin composition may be adjusted according to the production process used, preferably being 45 wt % to 85 wt % and more preferably being 55 wt % to 75 wt %, so as to provide a suitable viscosity for forming an insulation material on the ultra-thin copper foil.

(2) Formation of assembly: using various known methods to apply the resin varnish to form the assembly.

For example, in one embodiment, a suitable application apparatus (e.g., coating apparatus) is used to apply the resin varnish, such as by impregnation or coating, to the ultra-thin copper foil; next, it is subject to high temperature heating and baking to form a semi-cured insulation material, thereby obtaining the assembly of the present disclosure. The above-mentioned coating apparatus is not particularly limited, and useful coating apparatus may be a roller type coater, a bar type coater, a knife type coater, a gravure type coater, a die type coater, a comma type coater or a curtain type coater, wherein die type coater and roller type coater are preferably used so as to produce an assembly with uniform insulation material thickness with higher efficiency and avoid the formation of voids.

Alternatively, a sprayer may be used to spray-coat the resin varnish onto the ultra-thin copper foil, followed by high temperature heating, to obtain the assembly of the present disclosure, such as a resin film with copper foil (a.k.a. a resin sheet attached with copper foil) without performing high temperature lamination.

In another embodiment, reinforcement material such as fiberglass fabric may be impregnated in the resin varnish, followed by heating at high temperature to form a prepreg, and then the prepreg is combined with an ultra-thin copper foil, so as to obtain the assembly of the present disclosure.

In another embodiment, the resin varnish is coated on a PET film, a liquid crystal polymer resin film or a PI film and subject to heating at high temperature to form a resin film, which is then combined with an ultra-thin copper foil to obtain the assembly of the present disclosure.

According to the present disclosure, the assembly thus made according to the aforesaid processes may have an insulation material not completely cured, such as in a state of partially cured (B-stage).

Various processes can be performed, if needed, to prepare various articles from the assembly, comprising but not limited to a prepreg with copper foil, a resin film with copper foil, a laminate or a printed circuit board.

For example, the insulation material can be heated at high temperature to volatilize the solvent, and the specific heating temperature can be adjusted according to the solvent chosen, such as but not limited to 110° C. to 200° C., preferably 110° C. to 190° C.

The thickness of the insulation material is not particularly limited and may be adjusted according to actual needs; for example, insulation material without reinforcement material may have a thickness of 1 to 75 μm, preferably 5 to 50 μm, and insulation material with reinforcement material may preferably have a thickness of 25 to 75 μm. The thickness of the insulation material greater than or equal to the aforesaid lower limit is useful for increasing the reliability of the insulation layer, and the thickness of the insulation material less than or equal to the aforesaid upper limit is useful for reducing the film thickness to enable the production of multi-layer printed circuit boards with the formation method and to fill the unevenness of inner layer circuits.

In addition, the assembly of the present disclosure may be used to make a laminate, such as but not limited to a copper-clad laminate, which comprises at least one aforesaid assembly of copper foil and insulation material. The copper-clad laminate can be made by superimposing the assembly with other insulation layer and/or metal foil and performing high temperature lamination. The metal foil may be any metal foil commonly used in the art, such as a copper foil, and may further comprise an alloy of copper and at least one of aluminum, nickel, platinum, silver and gold.

In addition, the assembly of the present disclosure can be used to make a multi-layer copper clad laminate, by sequentially superimposing the assembly of copper foil and insulation material, other insulation layer and/or copper foil in any order, copper foil layer or the assembly of copper foil and insulation material, followed by lamination at high temperature and high pressure to obtain the multi-layer copper clad laminate. Lamination conditions employed may be those commonly used in the art.

In addition, the assembly of the present disclosure can be used to make a printed circuit board, by contacting the insulation material side of the assembly of copper foil and insulation material with the board surface formed with a circuit pattern, so as to lay the assembly of copper foil and insulation material on the substrate (as shown in FIG. 2), followed by peeling off the removable carrier.

In addition, according to known methods in the art, a semiconductor element may be mounted on the printed circuit board, followed by a reflow process to obtain a semiconductor device.

The assembly of the present disclosure and various articles made therefrom have any one or a combination of the following properties:

(1) Higher peel strength as measured by reference to IPC-TM-650 2.4.8. For example, if a 1 oz copper foil is used, the peel strength between the copper foil and the insulation material may be greater than or equal to 8.0 lb/in, such as between 8.0 lb/in and 9.0 lb/in; for example, if an ultra-thin copper foil with a thickness of less than or equal to 3 μm is used, the peel strength between the copper foil and the insulation material may be greater than or equal to 5.0 lb/in, such as between 5.0 lb/in and 6.6 lb/in; for example, if an ultra-thin copper foil with a thickness of less than or equal to 2 μm is used, the peel strength between the copper foil and the insulation material may be greater than or equal to 4.2 lb/in, such as between 4.2 lb/in and 5.7 lb/in.

(2) Higher glass transition temperature (Tg) as measured by reference to IPC-TM-650 2.4.24.4. For example, the glass transition temperature is greater than or equal to 185° C., such as between 190° C. and 220° C.

(3) Lower dimensional change after reflow as measured by reference to IPC-TM-650 2.4.39. For example, the dimensional change after reflow is less than or equal to 0.025%, such as between 0.010% and 0.025%.

(4) Better T288 thermal resistance as measured by reference to IPC-TM-650 2.4.24.1. For example, the time to blistering or delamination is greater than or equal to 30 minutes, such as greater than or equal to 60 minutes, 120 minutes, 180 minutes, 240 minutes or 300 minutes.

(5) Lower dielectric constant at 2 GHz as measured by reference to JIS C2565. For example, the dielectric constant is less than or equal to 3.80, such as between 3.70 and 3.80.

(6) Lower dissipation factor at 2 GHz as measured by reference to JIS C2565. For example, the dissipation factor is less than or equal to 0.0130, such as between 0.0090 and 0.0130.

The assembly of the present disclosure and various articles made therefrom preferably have any one or a combination of the following properties:

(1) Higher peel strength as measured by reference to IPC-TM-650 2.4.8. For example, if a 1 oz copper foil is used, the peel strength between the copper foil and the insulation material may be greater than or equal to 8.0 lb/in, such as between 8.0 lb/in and 9.0 lb/in; for example, if an ultra-thin copper foil with a thickness of less than or equal to 3 μm is used, the peel strength between the copper foil and the insulation material may be greater than or equal to 5.3 lb/in, such as between 5.3 lb/in and 6.5 lb/in; for example, if an ultra-thin copper foil with a thickness of less than or equal to 2 μm is used, the peel strength between the copper foil and the insulation material may be greater than or equal to 4.6 lb/in, such as between 4.6 lb/in and 5.6 lb/in.

(2) Higher glass transition temperature (Tg) as measured by reference to IPC-TM-650 2.4.24.4. For example, the glass transition temperature is greater than or equal to 190° C., such as between 190° C. and 220° C.

(3) Lower dimensional change after reflow as measured by reference to IPC-TM-650 2.4.39. For example, the dimensional change after reflow is less than or equal to 0.020%, such as between 0.010% and 0.020%.

(4) Better T288 thermal resistance as measured by reference to IPC-TM-650 2.4.24.1. For example, the time to blistering or delamination is greater than or equal to 60 minutes, such as greater than or equal to 60 minutes, 120 minutes, 180 minutes, 240 minutes or 300 minutes.

(5) Lower dielectric constant at 2 GHz as measured by reference to JIS C2565. For example, the dielectric constant is less than or equal to 3.80, such as between 3.70 and 3.80.

(6) Lower dissipation factor at 2 GHz as measured by reference to JIS C2565. For example, the dissipation factor is less than or equal to 0.0120, such as between 0.0090 and 0.0120.

The assembly of the present disclosure and various articles made therefrom more preferably have any one or a combination of the following properties:

(1) Higher peel strength as measured by reference to IPC-TM-650 2.4.8. For example, if a 1 oz copper foil is used, the peel strength between the copper foil and the insulation material may be greater than or equal to 8.0 lb/in, such as between 8.0 lb/in and 8.6 lb/in; for example, if an ultra-thin copper foil with a thickness of less than or equal to 3 μm is used, the peel strength between the copper foil and the insulation material may be greater than or equal to 5.8 lb/in, such as between 5.8 lb/in and 6.5 lb/in; for example, if an ultra-thin copper foil with a thickness of less than or equal to 2 μm is used, the peel strength between the copper foil and the insulation material may be greater than or equal to 5.0 lb/in, such as between 5.0 lb/in and 5.6 lb/in.

(2) Higher glass transition temperature (Tg) as measured by reference to IPC-TM-650 2.4.24.4. For example, the glass transition temperature is greater than or equal to 190° C., such as between 190° C. and 215° C.

(3) Lower dimensional change after reflow as measured by reference to IPC-TM-650 2.4.39. For example, the dimensional change after reflow is less than or equal to 0.015%, such as between 0.012% and 0.015%.

(4) Better T288 thermal resistance as measured by reference to IPC-TM-650 2.4.24.1. For example, the time to blistering or delamination is greater than or equal to 60 minutes, such as greater than or equal to 60 minutes, 120 minutes, 180 minutes, 240 minutes or 300 minutes.

(5) Lower dielectric constant at 2 GHz as measured by reference to JIS C2565. For example, the dielectric constant is less than or equal to 3.80, such as between 3.70 and 3.80.

(6) Lower dissipation factor at 2 GHz as measured by reference to JIS C2565. For example, the dissipation factor is less than or equal to 0.0110, such as between 0.0095 and 0.0110.

In summary, the present disclosure provides an assembly and various articles made therefrom, characterized by having a low dielectric constant, a low dissipation factor, a high glass transition temperature, a high thermal resistance and/or a high flame retardancy; in particular, they have high dimensional stability after reflow and high peel strength to an ultra-thin copper foil and are therefore suitable for circuit boards with high speed and high frequency signal transmission.

Resin compositions in different examples and comparative examples and measurements made therefrom are described in detail below.

For resin compositions in different examples and comparative examples, trade names and product names are given below; unless otherwise specified, examples and comparative examples disclosed in this application all contribute to a part of the present disclosure.

TX-1467: oxazolidone epoxy resin, available from Nippon Steel & Sumikin Chemical.
HP-7200H: dicyclopentadiene epoxy resin, available from D.I.C. Corporation.
NC-3000: biphenyl epoxy resin, available from Nippon Kayaku.
NPPN-433A70: triphenylmethane epoxy resin, available from Nan Ya Plastics Corp.
HP-9900: naphthalene epoxy resin, available from D.I.C. Corporation.
PF-3500: oxydianiline type benzoxazine resin, available from Chang Chun Plastics.
LZ8290: bisphenol A type benzoxazine resin, available from Huntsman.
LZ8280: bisphenol F type benzoxazine resin, available from Huntsman.
LZ8270: phenolphthalein type benzoxazine resin, available from Huntsman.
EF-40: styrene maleic anhydride copolymer (styrene:maleic anhydride=4:1), available from Cray valley.
DDS: 4,4-diamino diphenyl sulfone, available from Atul Ltd.
TPN1: tetra-functional phenol, available from Nan Ya Plastics Corp.
DL0110: fused silica, available from Jinyi Silicon Materials Development Co., Ltd.
2E4MI: 2-ethyl-4-methylimidazole, available from Shikoku Chemicals Corp.
MEK: methyl ethyl ketone.

Preparation Example 1: Resin Varnish

According to the ingredients and amounts listed in Table 1 to Table 4 below, resin composition examples E1 to E19 and comparative examples C1 to C8 were prepared so as to obtain the resin varnish for each example and comparative example.

Preparation Example 2: Assembly of Copper Foil and Insulation Material (I)

The resin varnish from each example and comparative example was spray-coated respectively on a carrier-attached ultra-thin copper foil of 2 μm or 3 μm in thickness (wherein the ultra-thin copper foil has a thickness of 2 μm or 3 μm, and the carrier copper has a thickness of 18 μm), to uniformly adhere the resin varnish (thickness of about 30 μm), followed by heating to 160° C. for baking for 4 minutes to a semi-cured state, thereby obtaining an assembly of copper foil and insulation material (I), i.e., the resin film attached with copper foil (I).

Preparation Example 3: Assembly of Copper Foil and Insulation Material (II)

The resin varnish from each example and comparative example was coated respectively on a PET film or a PI film to uniformly adhere the resin varnish (thickness of about 30 μm) on the film, followed by heating and baking to the semi-cured state to obtain a resin film. Then the resin film was bonded to the copper foil side of the carrier-attached ultra-thin copper foil of 2 μm or 3 μm in thickness (wherein the ultra-thin copper foil has a thickness of 2 μm or 3 μm, and the carrier copper has a thickness of 18 μm) to form an assembly of copper foil and insulation material (II), i.e., the resin film attached with copper foil (II).

Preparation Example 4: Assembly of Copper Foil and Insulation Material (III)

The resin varnish from each example and comparative example was loaded respectively into an impregnation tank, and a fiberglass fabric (2116 fiberglass fabric, available from Nan Ya Plastics Corp.) was passed through the impregnation tank to adhere the resin varnish to the fiberglass fabric, followed by heating and baking to the semi-cured state to obtain a prepreg, which was then bonded to the copper foil side of the carrier-attached ultra-thin copper foil of 2 μm or 3 μm in thickness (wherein the ultra-thin copper foil has a thickness of 2 μm or 3 μm, and the carrier copper has a thickness of 18 μm) to form an assembly of copper foil and insulation material (III), i.e., the prepreg attached with copper foil.

Preparation Example 5: Laminate

Pick two pieces of each prepreg prepared above, two pieces of 2 μm or 3 μm carrier-attached ultra-thin copper foil (wherein the ultra-thin copper foil has a thickness of 2 μm or 3 μm, and the carrier copper has a thickness of 18 μm) and other insulation layer substrate (7628*4, representing a substrate made by laminating 4 pieces of prepregs containing 7268 fiberglass fabrics) for superimposition in the order of carrier-attached ultra-thin copper foil, prepregs, other insulation layer substrate, prepregs, carrier-attached ultra-thin copper foil, followed by lamination in vacuum at 195° C. for 2 hours, so as to form a laminate comprising a resin sheet of the assembly of copper foil and insulation material.

Preparation Example 6: Printed Circuit Board

Provide a double-sided copper-clad laminate (such as product name EM-827, available from Elite Material Co., Ltd.) with a thickness of 28 mil and a 1 oz HTE (High Temperature Elongation) copper foil, and subject the double-sided copper-clad laminate to hole-drilling and then electroplating, so as to form electrical conduction between the upper layer copper foil and the bottom layer copper foil. Then etch the upper layer copper foil and the bottom layer copper foil to form inner layer circuits. Then perform brown oxidation and roughening on the inner layer circuits to form uneven structures on the surface to increase roughness. Next, use a vacuum lamination apparatus to laminate the assembly of copper foil and insulation material thus prepared on the inner layer circuits, followed by heating at 195° C. for 75 minutes to cure the insulation material, and remove the carrier of the carrier-attached ultra-thin copper foil. In this embodiment, the condition used for stacking the assembly of copper foil and insulation material is 100° C. temperature, 1 MPa pressure, and a duration of 30 seconds.

Using the steps above, a laminate containing the inner layer circuits and assembly of copper foil and insulation material was obtained. Next, perform black oxidation, drilling, copper plating and other known circuit board processes on the outmost ultra-thin copper foil so as to obtain the printed circuit board.

TABLE 1

| | Component | | E1 | E2 | E3 | E4 | E5 | E6 |
|---|---|---|---|---|---|---|---|---|
| epoxy resin | oxazolidone epoxy resin | TX-1467 | 30 | 30 | 30 | 30 | 20 | 60 |
| | dicyclopentadiene epoxy resin | HP-7200H | 70 | | | | 80 | 40 |
| | biphenyl epoxy resin | NC-3000 | | 70 | | | | |
| | triphenylmethane epoxy resin | NPPN-433A70 | | | 70 | | | |
| | naphthalene epoxy resin | HP-9900 | | | | 70 | | |
| benzoxazine resin | oxydianiline type benzoxazine resin | PF-3500 | 30 | 30 | 30 | 30 | 30 | 30 |
| | bisphenol A type benzoxazine resin | LZ8290 | | | | | | |
| | bisphenol F type benzoxazine resin | LZ8280 | | | | | | |
| | phenolphthalein type benzoxazine resin | LZ8270 | | | | | | |
| curing agent | acid anhydride curing agent | EF-40 | 15 | 15 | 15 | 15 | 15 | 15 |
| | amine curing agent | DDS | | | | | | |
| | phenol curing agent | TPN1 | | | | | | |
| inorganic filler | fused silica | DL0110 | 50 | 50 | 50 | 50 | 50 | 50 |
| catalyst | 2-ethyl-4-methylimidazole | 2E4MI | 0.3 | 0.3 | 0.3 | 0.3 | 0.3 | 0.3 |
| solvent | methyl ethyl ketone | MEK | 60 | 60 | 60 | 60 | 60 | 60 |
| laminate property | test item (method) | unit | E1 | E2 | E3 | E4 | E5 | E6 |
| glass transition temperature (Tg) | DMA | ° C. | 195 | 190 | 210 | 215 | 197 | 195 |
| resin shrinkage after reflow | three-dimensional | % | 0.012 | 0.012 | 0.014 | 0.012 | 0.015 | 0.014 |
| T288 | TMA | min | >60 | >60 | >60 | >60 | >60 | >60 |
| peel strength | 1 oz HTE copper foil | lb/in | 8.2 | 8.1 | 8.1 | 8.0 | 8.1 | 8.1 |
| | ultra-thin copper foil (2 μm) | lb/in | 5.2 | 5.1 | 5.1 | 5.1 | 5.2 | 5.6 |
| | ultra-thin copper foil (3 μm) | lb/in | 6.0 | 5.8 | 5.9 | 5.8 | 5.9 | 6.5 |
| dielectric constant (RC70%) | Dk@2 GHz | w/o unit | 3.70 | 3.75 | 3.80 | 3.75 | 3.70 | 3.75 |
| dissipation factor (RC70%) | Df@2 GHz | w/o unit | 0.0100 | 0.0095 | 0.0110 | 0.0095 | 0.0100 | 0.0100 |

TABLE 2

| | Component | | E7 | E8 | E9 | E10 | E11 | E12 |
|---|---|---|---|---|---|---|---|---|
| epoxy resin | oxazolidone epoxy resin | TX-1467 | 30 | 30 | 30 | 30 | 30 | 30 |
| | dicyclopentadiene epoxy resin | HP-7200H | 70 | 70 | 70 | 70 | 70 | 70 |
| | biphenyl epoxy resin | NC-3000 | | | | | | |
| | triphenylmethane epoxy resin | NPPN-433A70 | | | | | | |
| | naphthalene epoxy resin | HP-9900 | | | | | | |
| benzoxazine resin | oxydianiline type benzoxazine resin | PF-3500 | 20 | 80 | 30 | 30 | 30 | 30 |
| | bisphenol A type benzoxazine resin | LZ8290 | | | | | | |
| | bisphenol F type benzoxazine resin | LZ8280 | | | | | | |
| | phenolphthalein type benzoxazine resin | LZ8270 | | | | | | |

TABLE 2-continued

| | | | | | | | | |
|---|---|---|---|---|---|---|---|---|
| curing agent | acid anhydride curing agent | EF-40 | 15 | 15 | | | 10 | 30 |
| | amine curing agent | DDS | | | 3 | | | |
| | phenol curing agent | TPN1 | | | | 8 | | |
| inorganic filler | fused silica | DL0110 | 50 | 50 | 50 | 50 | 50 | 50 |
| catalyst | 2-ethyl-4-methylimidazole | 2E4MI | 0.3 | 0.3 | 0.3 | 0.3 | 0.3 | 0.3 |
| solvent | methyl ethyl ketone | MEK | 60 | 60 | 60 | 60 | 60 | 60 |

| laminate property | test item (method) | unit | E7 | E8 | E9 | E10 | E11 | E12 |
|---|---|---|---|---|---|---|---|---|
| glass transition temperature (Tg) | DMA | °C. | 194 | 210 | 200 | 200 | 198 | 190 |
| resin shrinkage after reflow | three-dimensional | % | 0.015 | 0.012 | 0.012 | 0.012 | 0.012 | 0.012 |
| T288 | TMA | min | >60 | >60 | >60 | >60 | >60 | >60 |
| peel strength | 1 oz HTE copper foil | lb/in | 8.0 | 8.6 | 8.2 | 8.2 | 8.2 | 8.0 |
| | ultra-thin copper foil (2 μm) | lb/in | 5.0 | 5.5 | 5.1 | 5.1 | 5.1 | 5.0 |
| | ultra-thin copper foil (3 μm) | lb/in | 5.8 | 6.3 | 6.0 | 6.0 | 6.0 | 5.8 |
| dielectric constant (RC70%) | Dk@2 GHz | w/o unit | 3.70 | 3.80 | 3.70 | 3.70 | 3.70 | 3.70 |
| dissipation factor (RC70%) | Df@2 GHz | w/o unit | 0.0100 | 0.0110 | 0.0105 | 0.0105 | 0.0100 | 0.0095 |

TABLE 3

| | Component | | E13 | E14 | E15 | E16 | E17 | E18 | E19 |
|---|---|---|---|---|---|---|---|---|---|
| epoxy resin | oxazolidone epoxy resin | TX-1467 | 30 | 30 | 30 | 30 | 10 | 70 | 100 |
| | dicyclopentadiene epoxy resin | HP-7200H | 70 | 70 | 70 | 70 | 90 | 30 | |
| | biphenyl epoxy resin | NC-3000 | | | | | | | |
| | triphenylmethane epoxy resin | NPPN-433A70 | | | | | | | |
| | naphthalene epoxy resin | HP-9900 | | | | | | | |
| benzoxazine resin | oxydianiline type benzoxazine resin | PF-3500 | 10 | 90 | 30 | 30 | 30 | 30 | 30 |
| | bisphenol A type benzoxazine resin | LZ8290 | | | | | | | |
| | bisphenol F type benzoxazine resin | LZ8280 | | | | | | | |
| | phenolphthalein type benzoxazine resin | LZ8270 | | | | | | | |
| curing agent | acid anhydride curing agent | EF-40 | 15 | 15 | 5 | 40 | 15 | 15 | 15 |
| | amine curing agent | DDS | | | | | | | |
| | phenol curing agent | TPN1 | | | | | | | |
| inorganic filler | fused silica | DL0110 | 50 | 50 | 50 | 50 | 50 | 50 | 50 |
| catalyst | 2-ethyl-4-methylimidazole | 2E4MI | 0.3 | 0.3 | 0.3 | 0.3 | 0.3 | 0.3 | 0.3 |
| solvent | methyl ethyl ketone | MEK | 60 | 60 | 60 | 60 | 60 | 60 | 60 |

| laminate property | test item (method) | unit | E13 | E14 | E15 | E16 | E17 | E18 | E19 |
|---|---|---|---|---|---|---|---|---|---|
| glass transition temperature (Tg) | DMA | °C. | 190 | 210 | 200 | 185 | 198 | 188 | 185 |
| resin shrinkage after reflow | three-dimensional | % | 0.025 | 0.020 | 0.018 | 0.020 | 0.020 | 0.016 | 0.012 |
| T288 | TMA | min | >60 | >60 | >60 | >60 | >60 | 40 | 30 |
| peel strength | 1 oz HTE copper foil | lb/in | 7.5 | 8.7 | 8.2 | 7.6 | 8.1 | 8.1 | 8.2 |
| | ultra-thin copper foil (2 μm) | lb/in | 4.6 | 5.6 | 5.1 | 4.7 | 4.2 | 5.6 | 5.7 |
| | ultra-thin copper foil (3 μm) | lb/in | 5.3 | 6.4 | 6.0 | 5.5 | 5.0 | 6.5 | 6.6 |
| dielectric constant (RC70%) | Dk@2 GHz | w/o unit | 3.70 | 3.80 | 3.70 | 3.70 | 3.70 | 3.70 | 3.70 |
| dissipation factor (RC70%) | Df@2 GHz | w/o unit | 0.0100 | 0.0120 | 0.0105 | 0.0095 | 0.0100 | 0.0100 | 0.0100 |

TABLE 4

| | Component | | C1 | C2 | C3 | C4 | C5 | C6 | C7 | C8 |
|---|---|---|---|---|---|---|---|---|---|---|
| epoxy resin | oxazolidone epoxy resin | TX-1467 | | | | 30 | 30 | 30 | 30 | 30 |
| | dicyclopentadiene epoxy resin | HP-7200H | 70 | 70 | 100 | 70 | 70 | 70 | 70 | 70 |
| | biphenyl epoxy resin | NC-3000 | 30 | | | | | | | |
| | triphenylmethane epoxy resin | NPPN-433A70 | | 30 | | | | | | |
| | naphthalene epoxy resin | HP-9900 | | | | | | | | |
| benzoxazine resin | oxydianiline type benzoxazine resin | PF-3500 | 30 | 30 | 30 | | | | | 30 |
| | bisphenol A type benzoxazine resin | LZ8290 | | | | 30 | | | | |
| | bisphenol F type benzoxazine resin | LZ8280 | | | | | 30 | | | |
| | phenolphthalein type benzoxazine resin | LZ8270 | | | | | | 30 | | |
| curing agent | acid anhydride curing agent | EF-40 | 15 | 15 | 15 | 15 | 15 | 15 | 15 | |
| | amine curing agent | DDS | | | | | | | | |
| | phenol curing agent | TPN1 | | | | | | | | |
| inorganic filler | fused silica | DL0110 | 50 | 50 | 50 | 50 | 50 | 50 | 50 | 50 |
| catalyst | 2-ethyl-4-methyl-imidazole | 2E4MI | 0.3 | 0.3 | 0.3 | 0.3 | 0.3 | 0.3 | 0.3 | 0.3 |
| solvent | methy ethyl ketone | MEK | 60 | 60 | 60 | 60 | 60 | 60 | 60 | 60 |

| laminate property | test item (method) | unit | C1 | C2 | C3 | C4 | C5 | C6 | C7 | C8 |
|---|---|---|---|---|---|---|---|---|---|---|
| glass transition temperature (Tg) | DMA | °C. | 200 | 200 | 200 | 195 | 200 | 205 | 170 | 175 |
| resin shrinkage after reflow | three-dimensional | % | 0.018 | 0.018 | 0.025 | 0.030 | 0.035 | 0.033 | 0.040 | 0.035 |
| T288 | TMA | min | >60 | >60 | >60 | >60 | >60 | >60 | >60 | >60 |
| peel strength | 1 oz HTE copper foil | lb/in | 8.0 | 8.3 | 8.1 | 7.8 | 7.8 | 7.9 | 6.5 | 7.0 |
| | ultra-thin copper foil (2 μm) | lb/in | 3.7 | 3.7 | 3.6 | 3.6 | 3.6 | 3.7 | 2.9 | 3.4 |
| | ultra-thin copper foil (3 μm) | lb/in | 4.5 | 4.5 | 4.5 | 4.5 | 4.5 | 4.6 | 3.5 | 4.2 |
| dielectric constant (RC70%) | Dk@2 GHz | w/o unit | 3.70 | 3.70 | 3.70 | 3.65 | 3.65 | 3.75 | 3.70 | 3.75 |
| dissipation factor (RC70%) | Df@2 GHz | w/o unit | 0.0100 | 0.0110 | 0.0100 | 0.0095 | 0.0095 | 0.0110 | 0.0095 | 0.0120 |

For the property tests listed in Table 1 to Table 4, samples (specimens) were prepared as described below and tested under specified conditions set below.

1. Copper-Containing Laminate (e.g., Copper-Clad Laminate, Obtained by Laminating Eight Prepregs)

Two pieces of 0.5 ounce (oz) (thickness of 18 μm) HTE (High Temperature Elongation) copper foil and eight pieces of prepreg (2116 fiberglass fabrics) obtained from each sample were prepared, wherein each prepreg has a resin content of about 55%. A copper foil, eight prepregs and a copper foil were superimposed in such order and then subject to a vacuum condition for lamination at 195° C. for 2 hours to form each copper-clad laminate sample. In the sample, eight superimposed prepregs were cured to form the insulation material layer between the two copper foils, wherein the insulation material layer has a resin content of about 55%.

2. Copper-Free Laminate (Obtained by Laminating Eight Prepregs)

Each copper-containing laminate was etched to remove the two copper foils to obtain a copper-free laminate, formed by laminating eight prepregs and having a resin content of about 55%.

3. Copper-Free Laminate (Obtained by Laminating Two Prepregs)

Two pieces of 0.5 oz HTE copper foil and two pieces of prepreg (106 fiberglass fabric) obtained from each sample were prepared, wherein each prepreg has a resin content of about 70%. A copper foil, two prepregs and a copper foil were superimposed in such order and then subject to a vacuum condition for lamination at 195° C. for 2 hours to form a two-layer laminate. Next, each copper-containing laminate was etched to remove the two copper foils to obtain a copper-free laminate, formed by laminating two prepregs and having a resin content of about 70%.

4. Circuit Board (Four-Layer)

A core was prepared as follows: preparing four first prepregs (e.g., EM-827 available from Elite Material Co., Ltd., using 7628 fiberglass fabric, RC=42%); at two sides of the four superimposed prepregs, covering a copper foil, followed by lamination and curing for 2 hours in vacuum at high temperature (195° C.) and high pressure (360 psi) to obtain a copper-containing core. Then the core was subject to a brown oxidation process to obtain a brown oxide core. Next, two sides on the outer layers of the brown oxide core were respectively covered with an assembly of copper foil and insulation material (III) from each example or comparative example, followed by lamination for 2 hours in vacuum at 195° C. to obtain a laminate containing ultra-thin copper foil. Carrier copper foil on the ultra-thin copper surface of the laminate was peeled off and electroplating of the whole plate was performed without cleaning, such that the copper layer has a thickness of 35 μm to form a four-layer circuit board.

Each specimen was analyzed as described below.

1. Glass Transition Temperature (Tg)

The copper-free laminate (obtained by laminating eight prepregs) specimen was subject to glass transition temperature measurement. A dynamic mechanical analyzer (DMA) was used by reference to IPC-TM-650 2.4.24.4 "Glass Transition and Modulus of Materials Used in High Density Interconnection (HDI) and Microvias-DMA Method" to measure each specimen.

2. Thermal Resistance (T288)

The copper-containing laminate (obtained by laminating eight prepregs) specimen was subject to T288 thermal resistance test of blistering or delamination. At a constant temperature of 288° C., a thermomechanical analyzer (TMA) was used by reference to IPC-TM-650 2.4.24.1 "Time to Delamination (TMA Method)" to measure each specimen and record the time to blistering or delamination.

3. Dielectric Constant (Dk) and Dissipation Factor (Df)

In dielectric constant and dissipation factor measurement, the copper-free laminate (obtained by laminating two prepregs) was tested by using a microwave dielectrometer available from AET Corp. by reference to JIS C2565 "Measuring methods for ferrite cores for microwave device" at 2 GHz for analyzing each specimen. Lower dielectric constant and lower dissipation factor represent better dielectric properties of the specimen, wherein a difference in Dk of greater than 0.05 represents a significant difference in dielectric constant of different laminates. A difference in Df of greater than 0.0005 represents a significant difference in dissipation factor of different laminates.

4. Ordinary Copper Foil Peel Strength (P/S)

The copper-containing laminate (obtained by laminating eight prepregs) was replaced by the copper-clad laminate containing 1 oz HTE copper foil, and the peel strength (lb/in) of the laminate to the copper foil was measured by reference to IPC-TM-650 2.4.8 "Peel Strength of Metallic Clad Laminates".

5. Ultra-Thin Copper Foil Peel Strength (P/S)

The circuit board (four-layer) was used as the specimen for the measurement of the peel strength (lb/in) of the laminate to the 2 μm or 3 μm copper foil by reference to IPC-TM-650 2.4.8 "Peel Strength of Metallic Clad Laminates".

6. Laminate Shrinkage after Reflow (Dimensional Stability after Reflow)

In the laminate shrinkage after reflow (dimensional stability) test, two pieces of prepreg (2116 fiberglass fabric) were covered on two outer sides with a 0.5 oz HTE copper foil, and in such order (copper foil-prepreg-prepreg-copper foil), they were subject to lamination in vacuum at 195° C. for 2 hours to form a copper-containing laminate (thickness of 10 mil) as the specimen. Using a three-dimensional measuring instrument by reference to the process described in IPC-TM-650 2.4.39 "Dimensional Stability, Glass Reinforced Thin Laminates" to test the specimen, wherein the etched copper-free laminate before reflow was tested first (pre-reflow), and then the etched copper-free laminate was subject to one 260° C. reflow cycle and tested again (post-reflow). The method employed by the present disclosure is different from IPC-TM-650 2.4.39 as it measured the dimensional change of a laminate before and after reflow, wherein lower reflow shrinkage represents better laminate properties.

In particular, reflow shrinkage represents the dimensional change of a copper-free laminate subject to one reflow cycle and has a unit of %. The reflow shrinkage may be calculated by the following equation: reflow shrinkage=(dimension of copper-free laminate after reflow−dimension of copper-free laminate before reflow)/dimension of copper-free laminate before reflow)*100%.

Based on the test results from Table 1 to Table 4, it is apparent that by using the solution according to the present disclosure (E1 to E19), at least one laminate property is superior to those using other solutions. More unexpectedly, resin compositions according to the present disclosure achieve better ultra-thin copper foil peel strength and exhibit excellent shrinkage after reflow, indicating the alleviation of laminate deformation problem and high dimensional stability. Accordingly, the present disclosure realizes higher structural stability and reliability.

Specifically, various examples and embodiments of the present disclosure achieve at the same time high peel strength (e.g., a peel strength of ordinary copper foil of greater than or equal to 7.5 lb/in, preferably greater than 8.0 lb/in, a peel strength of 3 μm ultra-thin copper foil of greater than or equal to 5.0 lb/in, preferably greater than 5.5 lb/in, and a peel strength of 2 μm ultra-thin copper foil of greater than or equal to 4.2 lb/in, preferably greater than 5.0 lb/in), high glass transition temperature (e.g., greater than or equal to 185° C.), small dimensional change after reflow (e.g., less than or equal to 0.025%), high thermal resistance (e.g., T288 of greater than or equal to 30 minutes without blistering or delamination), low dielectric constant (e.g., less than or equal to 3.80), and low dissipation factor (e.g., less than or equal to 0.0130). In contrast, comparative examples fail to meet one or more preferred properties described above.

For example, by comparing examples E1 to E19 with comparative examples C4 to C7, it can be observed that oxydianiline type benzoxazine resin unexpectedly improves the dimensional change after reflow and peel strength of the ultra-thin copper foil. On the other hand, by comparing examples E1 to E19 with comparative examples C1 to C3, it can be observed that oxazolidone epoxy resin unexpectedly improves the peel strength of ultra-thin copper foil.

The above detailed description is merely illustrative in nature and is not intended to limit the embodiments of the subject matter or the applications and uses of such embodiments. As used herein, the term "exemplary" means "serving as an example, instance, or illustration." Any implementation described herein as exemplary is not necessarily to be construed as preferred or advantageous over other implementations.

Moreover, while at least one exemplary example or comparative example has been presented in the foregoing detailed description, it should be appreciated that a vast number of variations exist. It should also be appreciated that the exemplary one or more embodiments described herein are not intended to limit the scope, applicability, or configuration of the claimed subject matter in any way. Rather, the foregoing detailed description will provide those skilled in the art with a convenient guide for implementing the described one or more embodiments. Also, the scope defined by the claims includes known equivalents and foreseeable equivalents at the time of filing this patent application.

What is claimed is:

1. An assembly comprising an insulation material and a copper foil disposed on the insulation material, wherein:
the copper foil has a thickness of less than or equal to 6 μm; and
the insulation material is made from a resin composition comprising oxazolidone epoxy resin, oxydianiline type benzoxazine resin and a curing agent.

2. The assembly according to claim 1, further comprising a removable carrier disposed on the copper foil.

3. The assembly according to claim 1, wherein the copper foil has a thickness of between 0.5 μm and 5 μm.

4. The assembly according to claim 1, wherein the resin composition further comprises: bisphenol A epoxy resin, bisphenol F epoxy resin, bisphenol S epoxy resin, bisphenol AD epoxy resin, phenol novolac epoxy resin, trifunctional epoxy resin, tetrafunctional epoxy resin, dicyclopentadiene epoxy resin, biphenyl epoxy resin, phosphorus-containing epoxy resin, p-xylene epoxy resin, naphthalene epoxy resin, benzofuran epoxy resin, or a combination thereof.

5. The assembly according to claim 1, wherein the oxazolidone epoxy resin is represented by the following formula (I):

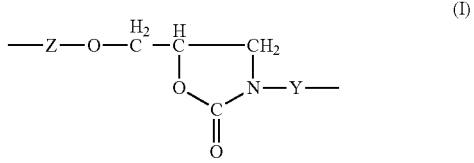

wherein Y and Z independently represent a divalent group with or without a substituent.

6. The assembly according to claim 1, wherein the oxydianiline type benzoxazine resin is represented by the following formula (II):

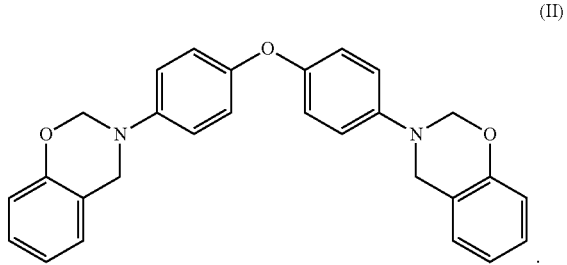 [SMILES: c1ccc2c(c1)CN(c1ccc(Oc3ccc(N4COc5ccccc5C4)cc3)cc1)CO2]

7. The assembly according to claim 1, wherein the curing agent comprises an acid anhydride curing agent, an amine curing agent, a phenol curing agent or a combination thereof.

8. The assembly according to claim 1, wherein the resin composition further comprises: a curing accelerator, a flame retardant, an inorganic filler, a solvent, a toughening agent, a silane coupling agent, or a combination thereof.

9. The assembly according to claim 1, wherein the resin composition comprises 20 to 60 parts by weight of the oxazolidone epoxy resin, 20 to 80 parts by weight of the oxydianiline type benzoxazine resin and 1 to 30 parts by weight of the curing agent.

10. The assembly according to claim 1, wherein the resin composition further comprises polyphenylene ether resin, benzoxazine resin, cyanate ester resin, isocyanate resin, polyolefin resin, maleimide resin, polyester, polyamide, (meth)acrylic resin, polyimide or a combination thereof.

11. An article made by the assembly according to claim 1, comprising a prepreg with copper foil, a resin film with copper foil, a laminate or a printed circuit board.

12. The article according to claim 11, having a peel strength as measured by reference to IPC-TM-650 2.4.8 of between 5.0 lb/in and 8.0 lb/in.

13. The article according to claim 11, having at least one of the following properties:
a glass transition temperature as measured by reference to IPC-TM-650 2.4.24.4 of greater than or equal to 185° C.;
a dimensional change after reflow as measured by reference to IPC-TM-650 2.4.39 of less than or equal to 0.025%;
a T288 thermal resistance as measured by reference to IPC-TM-650 2.4.24.1 of greater than or equal to 30 minutes; and
a peel strength as measured by reference to IPC-TM-650 2.4.8 of greater than or equal to 4.2 lb/in.

14. The article according to claim 11, having at least one of the following properties:
a dielectric constant at 2 GHz as measured by reference to JIS C2565 of less than or equal to 3.80; and
a dissipation factor at 2 GHz as measured by reference to JIS C2565 of less than or equal to 0.0130.

15. The article according to claim 11, wherein the copper foil has a thickness of between 3 μm and 6 μm, and the article has a peel strength as measured by reference to IPC-TM-650 2.4.8 of between 5.0 lb/in and 8.0 lb/in.

16. The article according to claim 11, wherein the copper foil has a thickness of less than 3 μm, and the article has a peel strength as measured by reference to IPC-TM-650 2.4.8 of between 3.0 lb/in and 6.0 lb/in.

17. A prepreg made from a resin composition comprising oxazolidone epoxy resin, oxydianiline type benzoxazine resin and a curing agent, wherein the prepreg, after being combined with a copper foil having a thickness of less than or equal to 6 μm and cured, has a peel strength to the copper foil as measured by reference to IPC-TM-650 2.4.8 of between 3.0 lb/in and 8.0 lb/in.

18. A resin composition comprising oxazolidone epoxy resin, oxydianiline type benzoxazine resin and a curing agent, wherein the resin composition, after being at least partially cured, is combinable with a copper foil having a thickness of less than or equal to 6 μm to achieve a peel strength as measured by reference to IPC-TM-650 2.4.8 of between 4.2 lb/in and 8.0 lb/in.

* * * * *